(12) United States Patent
Gao et al.

(10) Patent No.: US 9,385,252 B2
(45) Date of Patent: Jul. 5, 2016

(54) METHOD FOR INSULATING ALUMINUM BACKBOARD OF PHOTOVOLTAIC

(71) Applicant: HANWHA SOLARONE (QIDONG) CO., LTD, Qidong (CN)

(72) Inventors: Yuanzhun Gao, Qidong (CN); Songhua Xue, Qidong (CN); Xianghua Yang, Qidong (CN); Jialin Gong, Qidong (CN); Chao Yang, Qidong (CN); Zhong Dong, Qidong (CN); Xiaodan Shi, Qidong (CN); Juanjuan Zhu, Qidong (CN); Jidong Xia, Qidong (CN)

(73) Assignee: HANWHA SOLARONE (QIDONG) CO., LTD, Qidong (CN)

( * ) Notice: Subject to any disclaimer, the term of this patent is extended or adjusted under 35 U.S.C. 154(b) by 262 days.

(21) Appl. No.: 14/365,686

(22) PCT Filed: Jul. 25, 2013

(86) PCT No.: PCT/CN2013/080126
§ 371 (c)(1),
(2) Date: Jun. 16, 2014

(87) PCT Pub. No.: WO2014/086156
PCT Pub. Date: Jun. 12, 2014

(65) Prior Publication Data
US 2014/0338190 A1 Nov. 20, 2014

(30) Foreign Application Priority Data
Dec. 4, 2012 (CN) .......................... 2012 1 0510019

(51) Int. Cl.
| | |
|---|---|
| *H01R 43/00* | (2006.01) |
| *H01L 31/048* | (2014.01) |
| *H01L 31/18* | (2006.01) |
| *H01L 31/052* | (2014.01) |
| *H01L 31/049* | (2014.01) |
| *H02S 30/10* | (2014.01) |

(52) U.S. Cl.
CPC .......... *H01L 31/0487* (2013.01); *H01L 31/048* (2013.01); *H01L 31/049* (2014.12); *H01L 31/052* (2013.01); *H01L 31/18* (2013.01); *H02S 30/10* (2014.12); *Y02E 10/50* (2013.01); *Y10T 29/49117* (2015.01)

(58) Field of Classification Search
CPC . H01L 31/048; H01L 31/046; H01L 31/0475; H01L 51/448; H01L 51/5253; Y10T 442/2066; A61M 2025/1088
USPC ............ 29/825, 830, 841, 855; 525/251, 259, 525/342, 387
See application file for complete search history.

(56) References Cited

U.S. PATENT DOCUMENTS

| | | | |
|---|---|---|---|
| 7,902,301 B2 * | 3/2011 | Kempe ................. | C08K 3/0033 136/251 |
| 2004/0084078 A1* | 5/2004 | Yoshida .................. | H02S 20/00 136/251 |

*Primary Examiner* — Thiem Phan
(74) *Attorney, Agent, or Firm* — CBM Patent Consulting, LLC

(57) ABSTRACT

A method for insulating an aluminum backboard of a photovoltaic module comprises the following steps: shearing the aluminum backboard such that the dimensions of the aluminum backboard are 4-5 mm smaller those of the glass; forming a square aperture at the position of the electrode lead of the aluminum backboard; insulating the square aperture by cushioning a small insulating material or wrapping the edges with an insulation film when arraying and laying the modules; laminating and trimming the superimposed module components; wrapping the trimmed laminated piece around the edge with the 0.5-1 mm insulation tape; finally, framing up the laminated piece by using a frame filled with silica gel, and installing the terminal box. The invention is convenient to operate and low in investment and has a wide application prospect.

3 Claims, 2 Drawing Sheets

METHOD FOR INSULATING ALUMINUM BACKBOARD OF PHOTOVOLTAIC

This application is the U.S. national phase of International Application No. PCT/CN2013/080126 Filed 25 Jul. 2013 which designated the U.S. and claims priority to Chinese Application Nos. 201210510019.1 filed 4 Dec. 2012, the entire contents of each of which are hereby incorporated by reference.

BACKGROUND OF THE INVENTION

1. Technical Field

The invention relates to the insulation technology for the aluminum backboard of the photovoltaic module, belonging to the photovoltaic field.

2. Description of Related Art

Heat dissipation and vapor permeability are important indices for improving the power output and service life of the photovoltaic modules. As the applicant knows, the domestic and overseas photovoltaic industry tends to employ aluminum backboards with high heat dissipation and vapor permeability which are the preferred option to solve problems of heat dissipation and vapor perpetration of the photovoltaic modules. However, due to poor insulation, the aluminum backboards hardly withstand 6,000~8,000V high-voltage and are merely used in the crystal silicon modules.

BRIEF SUMMARY OF THE INVENTION

The objective of the invention is to provide a method for applying an aluminum backboard to photovoltaic modules and improving the insulation of the aluminum backboard of the photovoltaic module.

The technical scheme of the present invention is as follows:

A method for improving on the insulation of an aluminum backboard of a photovoltaic module, characterized by comprising the following steps:

(1) shearing the aluminum backboard such that both length and width of the aluminum backboard are smaller those of the glass;

(2) forming a square aperture at position of the electrode lead of the aluminum backboard;

(3) composing and laying module components and insulating the square aperture;

(4) laminating the superimposed module components;

(5) trimming the laminated piece;

(6) wrapping the trimmed laminated piece around the edges with an insulation tape;

(7) framing up the edged laminated piece by using a frame filled with silica gel and installing a terminal box;

After step (7), framing, is finished, the joints between the backboard and the aluminum frame are sealed with silica gel.

The method for insulating the square aperture in step (3) is cushioning the profile of the square aperture with a small insulating material or wrapping the square aperture around the edges with an insulation film.

According to the present invention, the aluminum backboard is sheared such that both length and width thereof are smaller than those of the glass; the electrode lead of the aluminum backboard is opened to form a square aperture which is subject to an insulating treatment when modules are arrayed and laid; the modules are laminated and trimmed; and then the trimmed laminated piece is wrapped around the edges. In this way, the problem of poor insulation between the aluminum backboard and the metal frame and between the aluminum backboard and the electrode lead is solved.

The aluminum backboard has high vapor isolation and heat conductivity, but this is merely applied to crystal silicon photovoltaic modules because it has poor insulation and is difficult to withstand 6 KV high voltage. Through shearing, both the length and width of the aluminum backboard are smaller than those of the glass. When modules are laminated, the EVA melts and cures to seal the sides of the aluminum backboard. Meanwhile, the insulation tape is employed to wrap the trimmed laminated piece around the edges so that the trimmed edge (side) of the backboard is prevented from directly getting in contact with the metal frame to result in short-circuit. The insulation tape provides the trimmed edge (side) with insulation protection. The electrode lead part of the aluminum backboard is formed with a square aperture and the edge of the square aperture is subjected to insulating treatment, thus preventing the cross section of the square aperture of the aluminum backboard from getting in contact with the electrode lead to cause a short-circuit and improving on the overall insulation and voltage-withstanding performance of the aluminum backboard to the maximum extent.

The invention can be quite compatible with the common industrial conventional module production line at present and can directly use the current conventional equipment, avoiding high investment in equipment, speeding up the industrial promotion and application of the aluminum backboard, and improving the insulation and voltage-withstanding performance of the aluminum backboard.

BRIEF DESCRIPTION OF THE SEVERAL VIEWS OF THE DRAWINGS

The invention is described in further detail with reference to the attached drawings and embodiments.

DETAILED DESCRIPTION OF THE INVENTION

Figure 1:
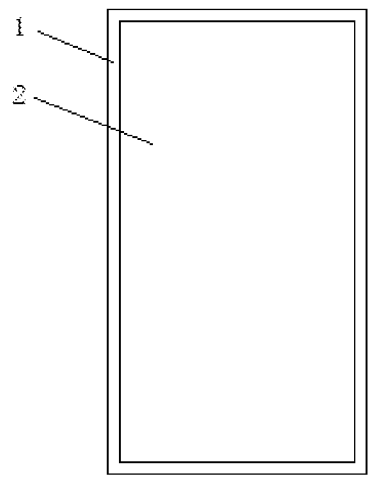
FIG. 1 shows the glass and the aluminum backboard.
Figure 2:
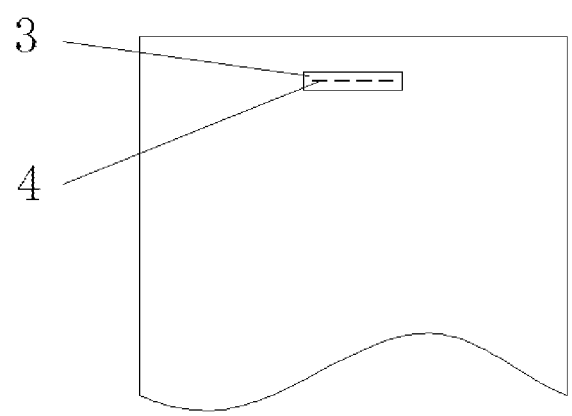
FIG. 2 illustrates the square aperture of the aluminum backboard.
Figure 3:
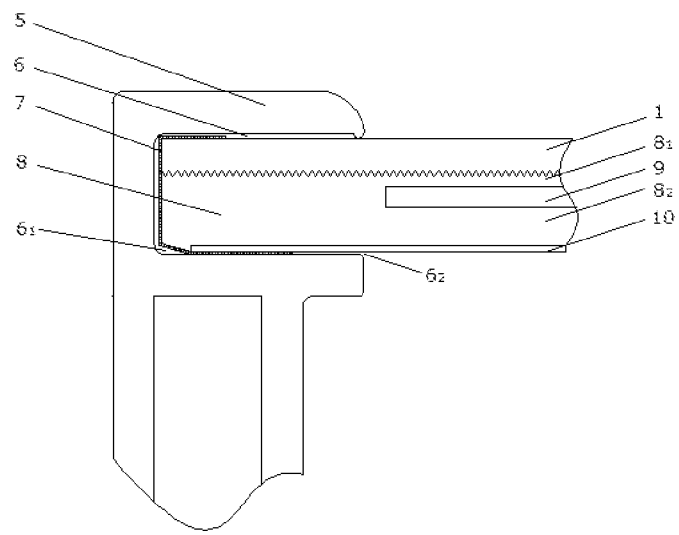
FIG. 3 is a sectional view of the edge of the laminated module.

A method for insulating an aluminum backboard of a photovoltaic module (as shown in FIG. 1, FIG. 2 and FIG. 3), comprising the following steps:

(1) shearing the aluminum backboard such that both length and width of the aluminum backboard 2 are 4~5 mm smaller than those of the coated toughened glass 1;

(2) forming a square aperture 3 at the position of the electrode lead 4 of the aluminum backboard 2;

(3) composing and laying the module components (in a sequence of: coated toughened glass 1, $EVA8_1$, cell 9, $EVA8_2$ and aluminum backboard 10), wherein $EVA8_1$ and $EVA8_2$ form an EVA layer 8), and insulating the square aperture 3;

(4) laminating the superimposed module components;

(5) trimming the laminated piece;

(6) wrapping the trimmed laminated piece around the edges with an insulation tape 7;

(7) framing up the wrapped laminated piece with an aluminum frame 5 filled with silica gel 6 (comprising silica gel $6_1$ and $6_2$ in the figure); and installing the terminal box.

After step (7), framing, is finished, the joints between the backboard and the aluminum frame are sealed with silica gel.

The method for insulating the square aperture in step (3) is cushioning the profile of the square aperture with a small insulating material or wrapping the square aperture around the edges with an insulation film.

The basic steps in the invention, such as composing and laying the module components, laminating the superimposed module components with a laminator, trimming the laminated piece, framing up and installing the terminal box, all are existing mature technical means, and therefore are not described in detail in this embodiment. The following are innovations of the present invention; the aluminum backboard is sheared such that the dimensions thereof are smaller than those of the glass, and then the melting and curing EVA encapsulates the sharp and prickly edge profile of the aluminum backboard and forms a smooth connection, thus providing the edge profile of the aluminum backboard with the first insulation and preventing the sharp and prickly profile from scratching and puncturing the subsequent insulation tape. Meanwhile, the insulation tape with a thickness of 0.5~1 mm is used to wrap the edge profile of the aluminum backboard and the edge of the laminated piece, thus improving the insulation of the edge profile of the aluminum backboard; the aluminum frame filled with silica gel is used to frame up the laminated piece, improving the sealing and insulation on the edge profile; the position of the electrode lead of the aluminum backboard is formed with a square aperture which is subject to an insulating treatment, and then the electrode lead penetrating through the aluminum backboard does not come in contact with the profile of the square aperture to avoid a short-circuit, thus solving the problem of insulation and voltage-withstanding failure of the photovoltaic modules made through the aluminum backboard and promoting application of the aluminum backboard in the crystal silicon modules. The present invention has prominent features and achieves remarkable progress.

Aside from the above embodiments, the present invention may have other embodiments. All technical solutions obtained by equivalent substitution or equivalent transformation shall be within the protection scope of the present invention.

What is claimed is:

1. A method for insulating an aluminum backboard of a photovoltaic module, comprises the following steps:
    (1) shearing the aluminum backboard such that the length and width of the aluminum backboard are both 4-5 mm smaller those of glass;
    (2) forming a square aperture at the position of the electrode lead of the aluminum backboard;
    (3) composing and laying the module components and insulating the square aperture;
    (4) laminating the superimposed module components;
    (5) trimming the laminated piece;
    (6) wrapping the trimmed laminated piece around the edges with an insulation tape;
    (7) framing the edged laminated piece with a frame filled with silica gel and installing a terminal box.

2. The method according to claim 1, wherein the method further includes that the joints between the backboard and the aluminum frame are sealed with silica gel after step (7).

3. The method according to claim 1, wherein the method for insulating the square aperture in step (3) is cushioning the profile of the square aperture with a small insulating material or wrapping the square aperture around the edges with an insulating film.

* * * * *